United States Patent
Wang et al.

(10) Patent No.: US 10,943,663 B1
(45) Date of Patent: Mar. 9, 2021

(54) METHOD OF PROGRAMMING IN FLASH MEMORY DEVICES

(71) Applicant: Yangtze Memory Technologies Co., Ltd., Wuhan (CN)

(72) Inventors: Yu Wang, Wuhan (CN); Shuang Li, Wuhan (CN); Khanh Nguyen, Wuhan (CN); Chunyuan Hou, Wuhan (CN); Qiang Tang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/660,773

(22) Filed: Oct. 22, 2019

Related U.S. Application Data

(63) Continuation of application No. PCT/CN2019/102969, filed on Aug. 28, 2019.

(51) Int. Cl.
  *G11C 7/00* (2006.01)
  *G11C 16/12* (2006.01)
  *G11C 11/56* (2006.01)
  *G11C 16/08* (2006.01)
  *G11C 16/34* (2006.01)

(52) U.S. Cl.
  CPC .......... *G11C 16/12* (2013.01); *G11C 11/5628* (2013.01); *G11C 16/08* (2013.01); *G11C 16/3459* (2013.01)

(58) Field of Classification Search
  CPC .............. G11C 11/161; G11C 11/5628; G11C 16/0483; G11C 16/08; G11C 16/10; G11C 16/24; G11C 16/3459; G11C 29/023; G11C 29/028; G11C 7/222
  See application file for complete search history.

(56) References Cited

U.S. PATENT DOCUMENTS

| | | | |
|---|---|---|---|
| 6,330,189 B1 | 12/2001 | Sakui |
| 7,778,083 B2 | 8/2010 | Moon |
| 7,848,150 B2 | 12/2010 | Lee |
| 8,027,202 B2 | 9/2011 | Lee |
| 8,605,512 B2 | 12/2013 | Kawamura |
| 8,811,075 B2 | 8/2014 | Nguyen |

(Continued)

FOREIGN PATENT DOCUMENTS

| | | |
|---|---|---|
| CN | 101388248 A | 3/2009 |
| CN | 101414483 A | 4/2009 |

(Continued)

*Primary Examiner* — Hien N Nguyen
(74) *Attorney, Agent, or Firm* — Winston Hsu

(57) ABSTRACT

A method of programming a flash memory device includes selecting a first wordline of a plurality of wordlines to select a selected wordline, the selected wordline corresponding to a target memory cell and performing a programming loop. The programming loop includes applying a program voltage to the selected wordline and performing a verification to the target memory cell. The verification includes applying a pre-pulse voltage to the selected wordline, applying a plurality of pass voltages to unselected wordlines of the plurality of wordlines, after applying the pre-pulse voltage, applying a series of incremental verifying voltages to the selected wordline, and after applying the pre-pulse voltage, applying a floating voltage to a second wordline of the plurality of wordlines. The second wordline being adjacent to the selected wordline is programmed after the selected wordline.

15 Claims, 9 Drawing Sheets

(56) References Cited

U.S. PATENT DOCUMENTS

| | | | |
|---|---|---|---|
| 9,318,202 B2 * | 4/2016 | Nam | G11C 16/34 |
| 9,589,660 B1 | 3/2017 | Hashimoto | |
| 9,653,168 B2 * | 5/2017 | Kim | G11C 16/3459 |
| 10,573,386 B2 | 2/2020 | Kim | |
| 2009/0067257 A1 * | 3/2009 | Lee | G11C 16/349 |
| | | | 365/185.33 |
| 2009/0219765 A1 | 9/2009 | Maejima | |
| 2009/0285026 A1 | 11/2009 | Kang | |
| 2014/0313823 A1 * | 10/2014 | Kim | G11C 16/10 |
| | | | 365/185.03 |

FOREIGN PATENT DOCUMENTS

| | | |
|---|---|---|
| CN | 101556827 A | 10/2009 |
| CN | 104160449 B | 2/2017 |
| CN | 108986861 A | 12/2018 |
| CN | 109308929 A | 2/2019 |
| CN | 109658964 A | 4/2019 |
| TW | 563241 | 11/2003 |
| TW | 201145291 A1 | 12/2011 |
| TW | 201342377 A | 10/2013 |
| TW | I606577 B | 11/2017 |

\* cited by examiner 2-bit cells 3-bit cells

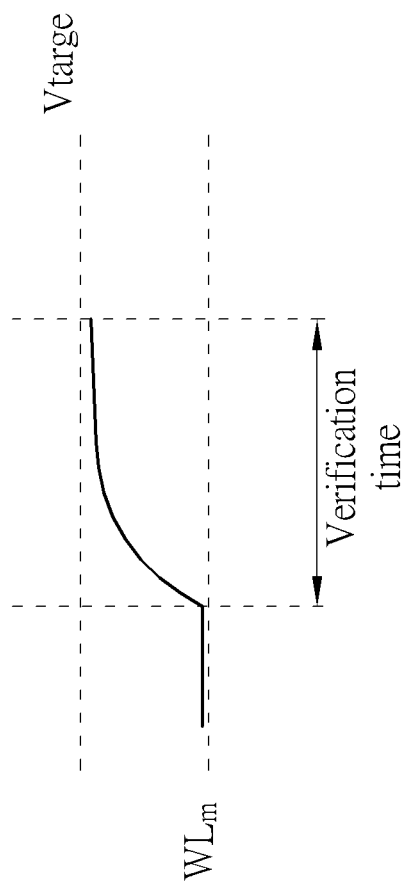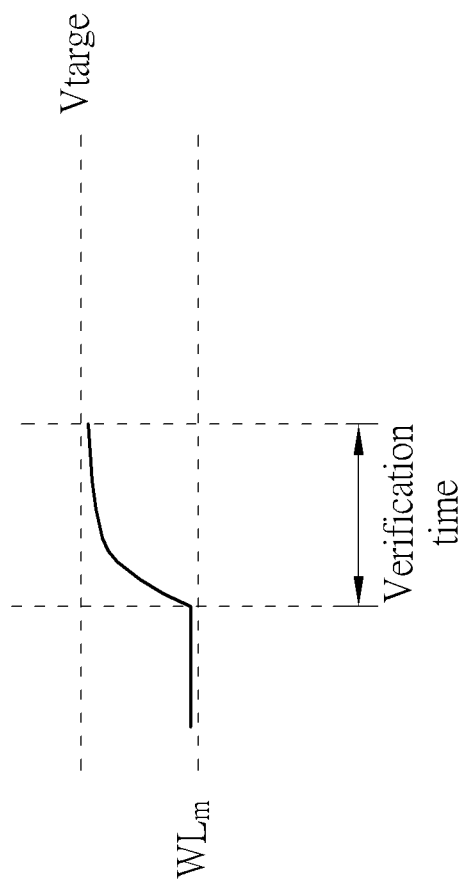

US 10,943,663 B1

METHOD OF PROGRAMMING IN FLASH MEMORY DEVICES

CROSS REFERENCE TO RELATED APPLICATIONS

This application is a continuation of International Application No. PCT/CN2019/102969, filed on Aug. 28, 2019, which is incorporated by reference herein in its entirety.

BACKGROUND OF THE INVENTION

1. Field of the Invention

The present invention is related to flash memory devices, and more particularly to programming methods in flash memory devices.

2. Description of the Prior Art

A non-volatile memory is a memory that can retain its stored data for an extended period without the application of power. Flash memory devices have developed into a popular type of non-volatile memory for a wide range of applications. Flash memory devices are commonly used in electronic systems, such as personal computers, digital cameras, digital media players, digital recorders, vehicles, wireless devices, cellular phones, and removable memory modules, and the uses for flash memory continue to expand.

A flash memory uses one of the two basic architectures known as NOR Flash and NAND Flash. Typically, an array of memory cells for NAND flash memory devices is arranged such that memory cells of a string are connected together in series, source to drain. A flash memory can comprise a memory array, which includes a large number of floating gate transistors. A NAND architecture array arranges its array of flash memory cells in a matrix of rows and columns, as a conventional NOR array does, so that the gates of each flash memory cell of the array are coupled by rows to word lines. However, unlike NOR, each memory cell is not directly coupled to a source line and a column bitline. Instead, the memory cells of the array are arranged together in strings, typically of 8, 16, 32, or more. The memory cells in the string are coupled together in series, source to drain, between a common source line and a column bitline.

Some flash memories are designed to store more than one bit of data per memory cell. Flash memories that store more than one bit of data per memory cell are referred to as multilevel cell (MLC) flash memories. MLC flash memories are typically programmed by using incremental step pulse programming (ISPP). In incremental step pulse programming, selected memory cells are programmed by multiple of programming loops, where each programming loop comprises a programming operation where a program voltage is applied to a selected memory cell to modify its state, and a verification operation where a verifying voltage is applied to the selected memory cell to determine whether it has reached a target state. By performing programming loops in this manner, selected memory cells are programmed gradually and can avoid certain programming errors such as over-programming.

SUMMARY OF THE INVENTION

An embodiment of a method of programming a flash memory device comprises selecting a first wordline of a plurality of wordlines to select a selected wordline, the selected wordline corresponding to a target memory cell and performing a programming loop. The programming loop comprises applying a program voltage to the selected wordline and performing a verification to the target memory cell. The verification comprises applying a pre-pulse voltage to the selected wordline, applying a plurality of pass voltages to unselected wordlines of the plurality of wordlines, after applying the pre-pulse voltage, applying a series of incremental verifying voltages to the selected wordline, and after applying the pre-pulse voltage, applying a floating voltage to a second wordline of the plurality of wordlines. The second wordline being adjacent to the selected wordline is programmed after the selected wordline.

An embodiment of a method of programming a flash memory device comprises selecting a first wordline of a plurality of wordlines to select a selected wordline, the selected wordline corresponding to a target memory cell and performing a programming loop. The programming loop comprises applying a program voltage to the selected wordline and performing a verification to the target memory cell. The verification comprises applying a pre-pulse voltage to the selected wordline, applying a plurality of pass voltages to unselected wordlines of the plurality of wordlines, after applying the pre-pulse voltage, applying a series of incremental verifying voltages to the selected wordline, and after applying the pre-pulse voltage, after applying the pre-pulse voltage, discharging a second wordline of the plurality of wordlines to a system voltage level, and after discharging the second wordline to the system voltage level, applying a floating voltage to the second wordline. The second wordline being adjacent to the selected wordline is programmed after the selected wordline.

An embodiment of a method of programming a flash memory device comprises selecting a first wordline of a plurality of wordlines to select a selected wordline, the selected wordline corresponding to a target memory cell and performing a programming loop. The programming loop comprises applying a program voltage to the selected wordline and performing a verification to the target memory cell. The verification comprises applying a pre-pulse voltage to the selected wordline, applying a plurality of pass voltages to unselected wordlines of the plurality of wordlines, after applying the pre-pulse voltage, applying a series of incremental verifying voltages to the selected wordline, and after applying the pre-pulse voltage, discharging a second wordline of the plurality of wordlines to a ground voltage level, and after discharging the second wordline to the ground voltage level, applying a floating voltage to the second wordline. The second wordline being adjacent to the selected wordline is programmed after the selected wordline.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6A is a diagram shows the verification time of the prior art. FIG. 6B is a diagram shows the verification time of an embodiment.

DETAILED DESCRIPTION

Figure 1:
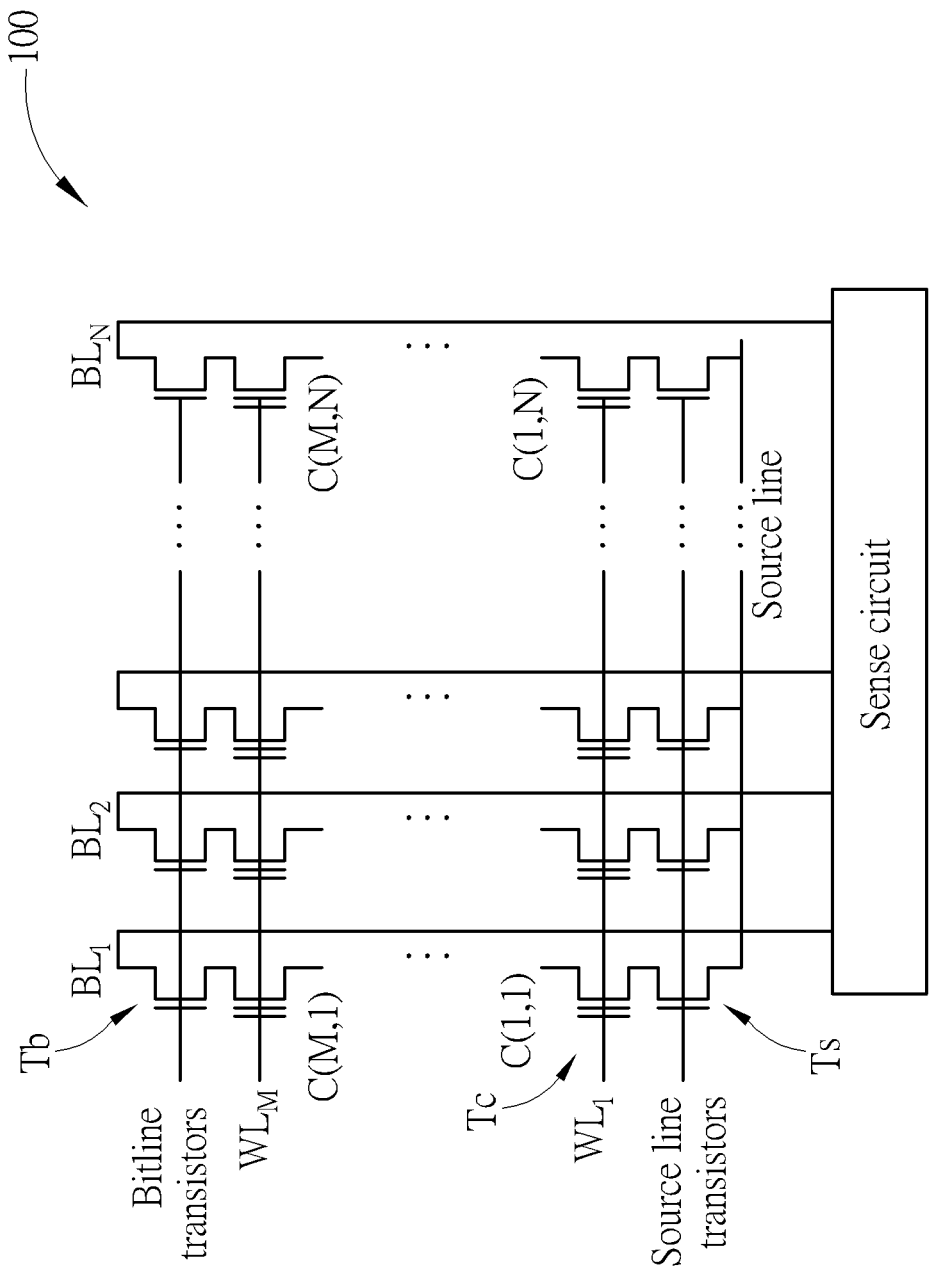
FIG. 1 is a diagram of a flash memory device implemented in an embodiment.

FIG. 1 shows a flash memory device 100 of an embodiment of the present invention. The flash memory device 100 includes a plurality of memory cells C(1,1) to C(M,N), where M and N are positive integers. In some embodiments of the present invention, the non-volatile memory device 100 can be a NAND type flash memory. N memory cells can be coupled to the same wordline and M memory cells can be coupled to the same bitline. For example, a row of memory cells C(1,1) to C(1,N) can be coupled to a wordline $WL_1$, and a row of memory cells C(M,1) to C(M,N) can be coupled to a wordline $WL_M$. A column of memory cells C (1,1) to C (M,1) can be coupled to a bitline $BL_1$, and a column of memory cells C(M,1) to C(M,N) can be coupled to a bitline $BL_N$. One terminal of a memory column is coupled to a bitline via a bitline transistor Tb corresponding to that memory column and the other terminal is coupled to a source line via a source line transistor Ts. The bitlines $BL_1$ to $BL_N$ are coupled to sense circuits (e.g., sense amplifier) 300 that detect the state of a target memory cell by sensing voltage or current on a selected bitline $BL_n$, where n is a positive integer between 1 and N inclusively. The flash memory device 100 further includes a control circuit (not shown in the figure) for implementing programming pulses to the memory cell array.

Memory cells C(1,1) to C(M,N) can be configured as single level memory cells (SLC) or multilevel memory cells (MLC). A data state is assigned to a memory cell with a specific range of threshold voltages stored in the memory cell. SLC allows a data of single binary digit in one memory cell, while MLC allows two or more binary digits to be stored in one memory cell depending on the range and tightness of the threshold voltage. For example, one bit may be represented by two threshold voltage ranges, two bits by four ranges and three bits by eight ranges . . . etc. SLC memory uses two threshold voltage ranges to store a single bit of data (two ranges), representing 0 or 1. MLC memory can be configured to store two bits of data (four ranges), three bits of data (eight ranges) or more.

Figure 2A:
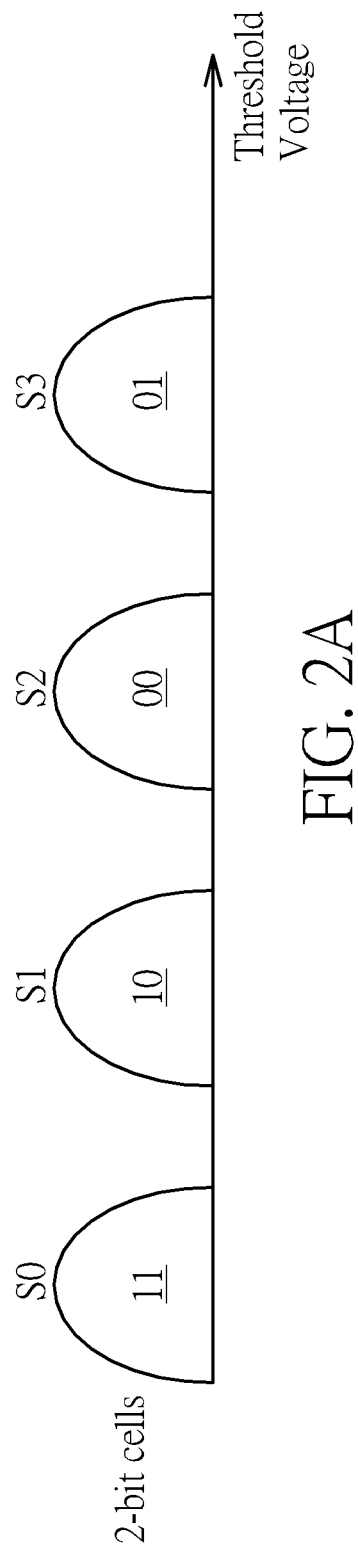
FIG. 2A is a diagram of an example of threshold voltage ranges of 2-bit MLC memory cells.

FIG. 2A is diagram of an example of threshold voltage ranges of 2-bit MLC memory cells. A memory cell might be programmed to a threshold voltage that falls within one of four different ranges S0, S1, S2 and S3; each represent a data state corresponding to a pattern of two bits. A margin is maintained between each range S0 to S3 to prevent overlapping. For example, if the voltage of a memory cell falls within the first threshold voltage range S0, the cell stores a "11" state, which usually represents an erased state. If the voltage of a memory cell falls within the second threshold voltage range S1, the cell stores a "10" state. If the voltage of a memory cell falls within the third threshold voltage range S2, the cell stores a "00" state. If the voltage of a memory cell falls within the fourth threshold voltage range S3, the cell stores a "01" state.

Figure 2B:
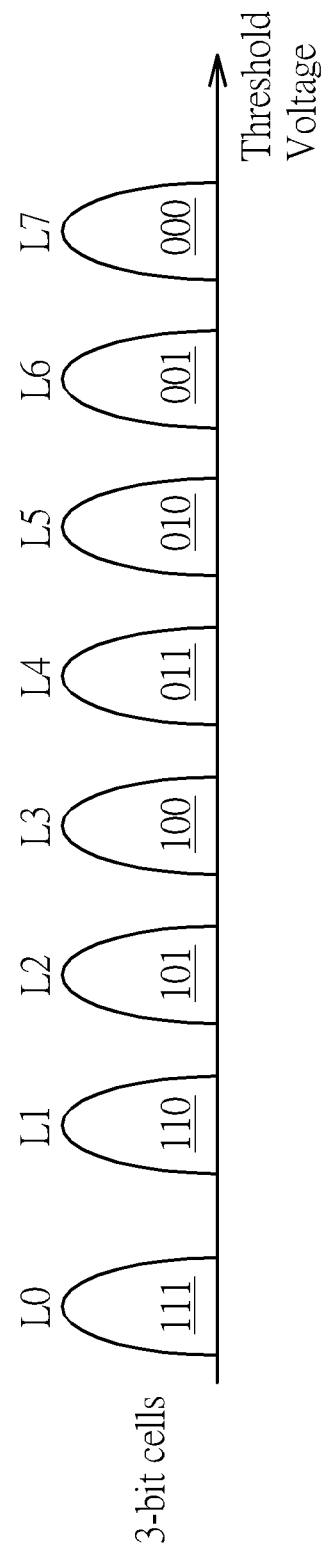
FIG. 2B is a diagram of an example of threshold voltage ranges of 3-bit MLC memory cells.

FIG. 2B is diagram of an example of threshold voltage ranges of 3-bit MLC memory cells. A memory cell might be programmed to a threshold voltage that falls within one of four different ranges L0, L1, L2, L3, L4, L5, L6 and L7; each represent a data state corresponding to a pattern of three bits. For example, if the voltage of a memory cell falls within the first threshold voltage range L0, the cell stores a "111" state, which usually represents an erased state. If the voltage of a memory cell falls within the second threshold voltage range L1, the cell stores a "110" state. If the voltage of a memory cell falls within the third threshold voltage range L2, the cell stores a "101" state. If the voltage of a memory cell falls within the fourth threshold voltage range L3, the cell stores a "100" state. If the voltage of a memory cell falls within the fifth threshold voltage range L4, the cell stores a "011" state. If the voltage of a memory cell falls within the sixth threshold voltage range L5, the cell stores a "010" state. If the voltage of a memory cell falls within the seventh threshold voltage range L6, the cell stores a "001" state. If the voltage of a memory cell falls within the eighth threshold voltage range L7, the cell stores a "000" state.

Flash programming involves applying one or more programming pulses to a wordline, for example wordline $WL_m$ in FIG. 1, where m is an integer between 1 and M. This is to control the gate of each memory cell C(m,1) to C(m,N). For example, programming pulses may start at 15V and increase for each subsequent programming pulse. This programming method is commonly known incremental step pulse programming (ISPP). While a programming pulse is applied to the wordline $WL_m$, a voltage is also applied to substrate having the channels of these memory cells resulting in a charge transfer from the channel to the floating gates of the selected memory cells. Electrons from the channels can be injected into the floating gates through direct injection or Fowler-Nordheim tunneling. Therefore, in a programmed state the threshold voltage is usually greater than zero.

Figure 3A:
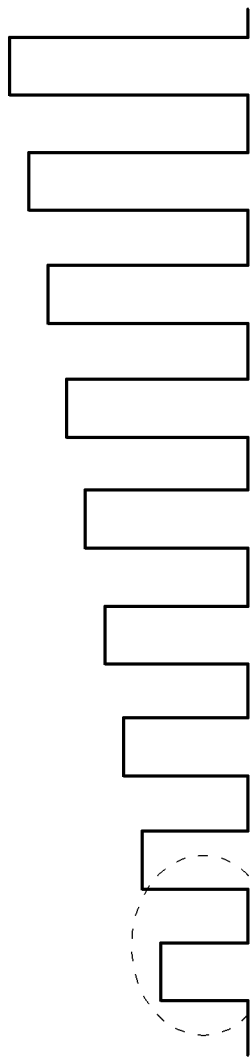
FIGS. 3A, 3B and 3C are diagrams illustrating incremental step pulse programming (ISPP) scheme used to program the selected memory cells.

FIG. 3A is a diagram further illustrating incremental step pulse programming (ISPP) scheme used to program the selected memory cells. The example of FIG. 3A is a general ISPP scheme. A program voltage of the programming pulses is applied to control the gates of the selected memory cells. The level of the program voltage of the programming pulses increases in each successive loop.

Figure 3B:
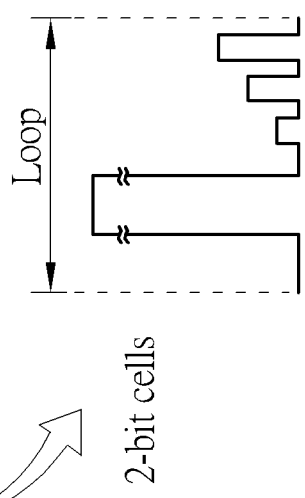
Figure 3C:
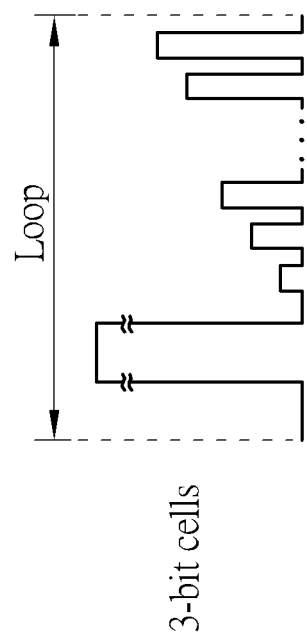

Between the programming pulses, a verification operation is performed to check the selected memory cells to determine whether they have reached their target programming state. In FIG. 3B, in a 2-bit MLC memory cell, verification operations are performed using a series of three increasing verifying voltages to determine whether a selected memory cell such as C (m,n) has been successfully programmed to a state corresponding to one of threshold voltage distributions S0 through S3 in FIG. 2A (e.g., the target state). Similarly in FIG. 3C, verification operations for an 3-bit MLC memory cell are performed using a series of seven increasing verifying voltages to determine whether a selected memory cell such as C(m,n) has been successfully programmed to a state corresponding to one of threshold voltage distributions L0 through L7 in FIG. 2B.

If a memory cell C (m,n) has reached its target programming state, it is inhibited and will not be programmed any further by biasing an inhibit voltage to the bitline $BL_n$ coupled to the memory cell C (m,n). Following the sensing operation, an additional programming pulse is applied if there are still memory cells having not completed programming. This process of applying programming pulses followed by performing the sensing operation continues until all the selected memory cells have reached their target programming states. When a maximum number of programming pulses have been applied and some selected memory cells still have not completed programming, those memory cells would be designated as defective memory cells.

Also in FIG. 1, a pass voltage is applied to each unselected wordline, for example, wordlines $WL_1$ to $WL_M$ except $WL_m$. The pass voltages applied may be different on different wordlines. A wordline $WL_{m-1}$ adjacent to the selected wordline $WL_m$ may have pass voltage of 9V and the other wordlines may have pass voltage of 8V. The pass voltages are always low enough to not initiate programming of memory cells. Also, an inhibit voltage is applied to the bitlines which are not coupled to the memory cell strings having memory cells selected for programming. During the programming operation, alternate bitlines can be activated or deactivated for programming. For example, even number bitlines such as $BL_2$, $BL_4$ . . . etc, can be activated for programming memory cells coupled to these bitlines while the odd numbered bitlines such as $BL_1$, $BL_3$ . . . etc, are deactivated from programming memory cells coupled to these bitlines. A subsequent programming operation can then deactivate the even number bitlines and activate the odd number bitlines.

The time required to perform programming operations using the ISPP scheme of FIG. 3A tends to increase proportionally according to the number of states of the memory cells. Furthermore, in these programming operations, verification operations tend to occupy a large part of the total programming time. Thus, a flash memory device needs a verification scheme that reduces the verification time even where the number of program states of the selected memory cells is relatively large.

Figure 4:
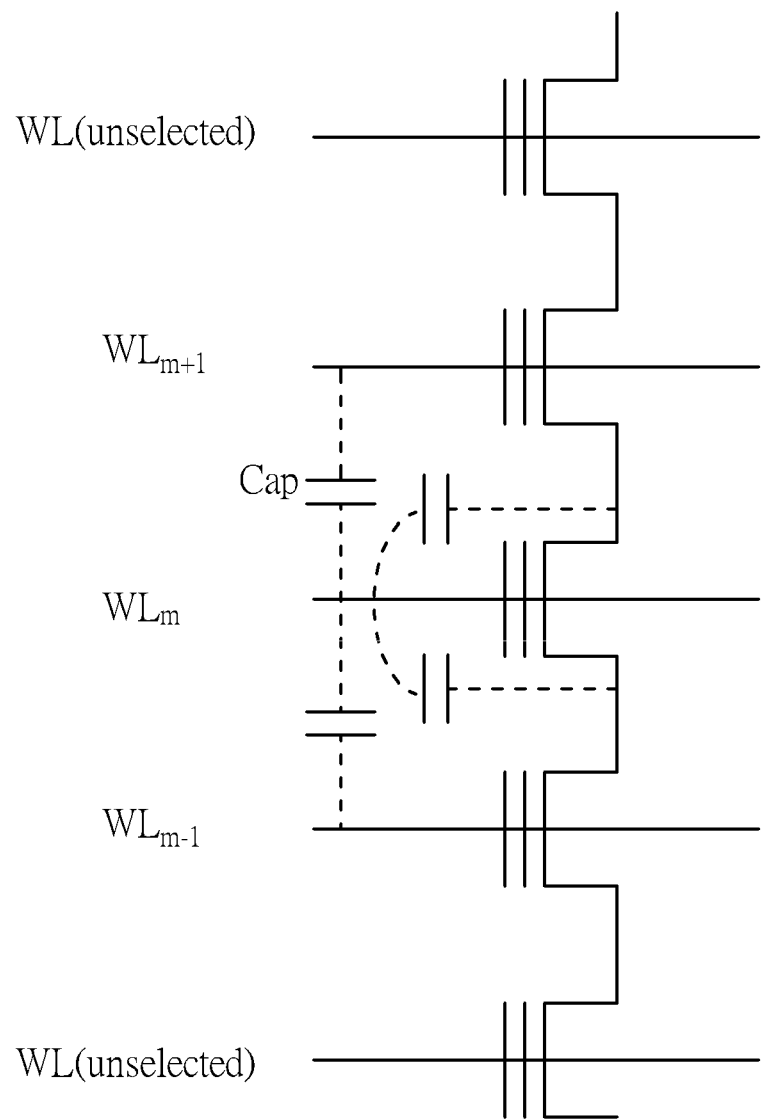
FIG. 4 is a diagram of a string of memory cells implemented in an embodiment.
Figure 5:
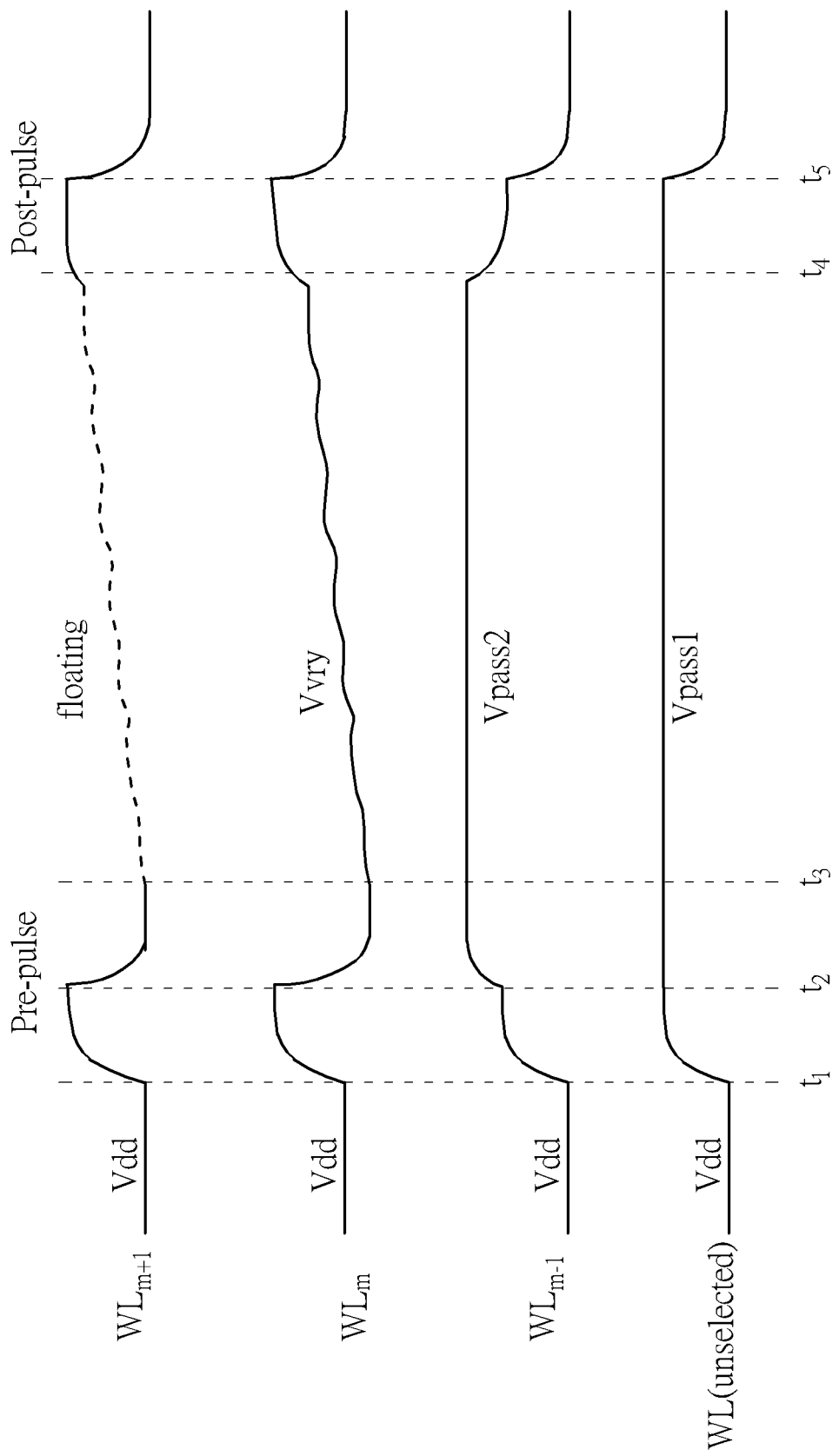
FIG. 5 illustrates a verification scheme of the programming method of an embodiment.

The following descriptions refer to FIGS. 4 and 5. FIG. 4 is a diagram of a string of memory cells implemented in an embodiment of present invention. FIG. 5 illustrates a verification scheme of the programming method of an embodiment of the present invention. In the verification operation, all the wordlines $WL_1$ to $WL_M$ start with a system voltage Vdd. At time t1, a pre-pulse voltage is applied to the selected wordline $WL_m$ and the first adjacent wordline $WL_{m+1}$. Also a first pass voltage Vpass1 is applied to the second adjacent wordline $WL_{m-1}$ the unselected wordlines (all wordlines except $WL_m$, $WL_{m+1}$). At time t2 the selected wordline $WL_m$ and the first adjacent wordline $WL_{m+1}$ begin to discharge. A second pass voltage Vpass2 is applied to the second adjacent wordline $WL_{m-1}$. The remaining unselected wordlines are maintained at the level of the first pass voltage Vpass1. At time t3, a series of incremental verifying voltages Vvry are applied to the selected wordline $WL_m$. in this case, seven verifying voltages are applied. Also, when voltage on the first adjacent wordline $WL_{m+1}$ drops to the system voltage Vdd, a floating voltage is applied to the first adjacent wordline $WL_{m+1}$. The voltage on the second adjacent wordline $WL_{m-1}$ is maintained at the second pass voltage Vpass2 and the voltage on the remaining unselected wordlines is maintained at the first pass voltage Vpass1. At time t4, a post-pulse voltage is applied to the selected wordline $WL_m$ and the first adjacent wordline $WL_{m+1}$. The second adjacent wordline $WL_{m-1}$ is discharged to the level of the first pass voltage Vpass1 and the voltage on the remaining unselected wordline is maintained at the first pass voltage Vpass1. At time t5, all wordlines, including $WL_m$, $WL_{m+1}$ and $WL_{m-1}$, are discharged to the level of the system voltage Vdd, thus finishing the verification operation. When the verifying voltage Vvry is applied at the selected wordline $WL_m$, the memory cells associated with the first adjacent wordline $WL_{m+1}$ is still in the erase state, thus applying the floating voltage on the first adjacent wordline $WL_{m+1}$ would not affect the subsequent programming operation. Since the second adjacent wordline $WL_{m-1}$ may no longer be in the erase state, a floating voltage should not be applied to the second adjacent wordline $WL_{m-1}$ to avoid altering the programmed cells therein. Further, during the verification operation, the floating voltage is raised by the coupling effect of the parasitic capacitor Cap between the selected wordline $WL_m$ and the first adjacent wordline $WL_{m+1}$.

FIG. 6A is a diagram shows the verifying voltage set up time of the prior art. FIG. 6B is a diagram shows the verifying voltage set up time of an embodiment of present invention. As illustrated in the figures, the method of the embodiment requires less time to reach a target verifying voltage Vtarget than the prior art. The parasitic capacitance Cap between the wordlines in FIG. 4 such as $WL_m$, $WL_{m+1}$ and $WL_{m-1}$, would influence the voltage charge time on those wordlines. When applying the floating voltage to the first adjacent wordline $WL_{m+1}$, the influence of the parasitic capacitance Cap is reduced so the ramp up time for the verifying voltage to reach the target verifying voltage Vtarget is shortened. Therefore, it can improve the overall programming performance. Also, by applying the floating voltage to the first adjacent wordline $WL_{m+1}$, the power consumption of the circuit can be reduced to some degree. Furthermore, the method can be implemented without the need of addition circuits adding complexity to the design and manufacturing.

Figure 7:
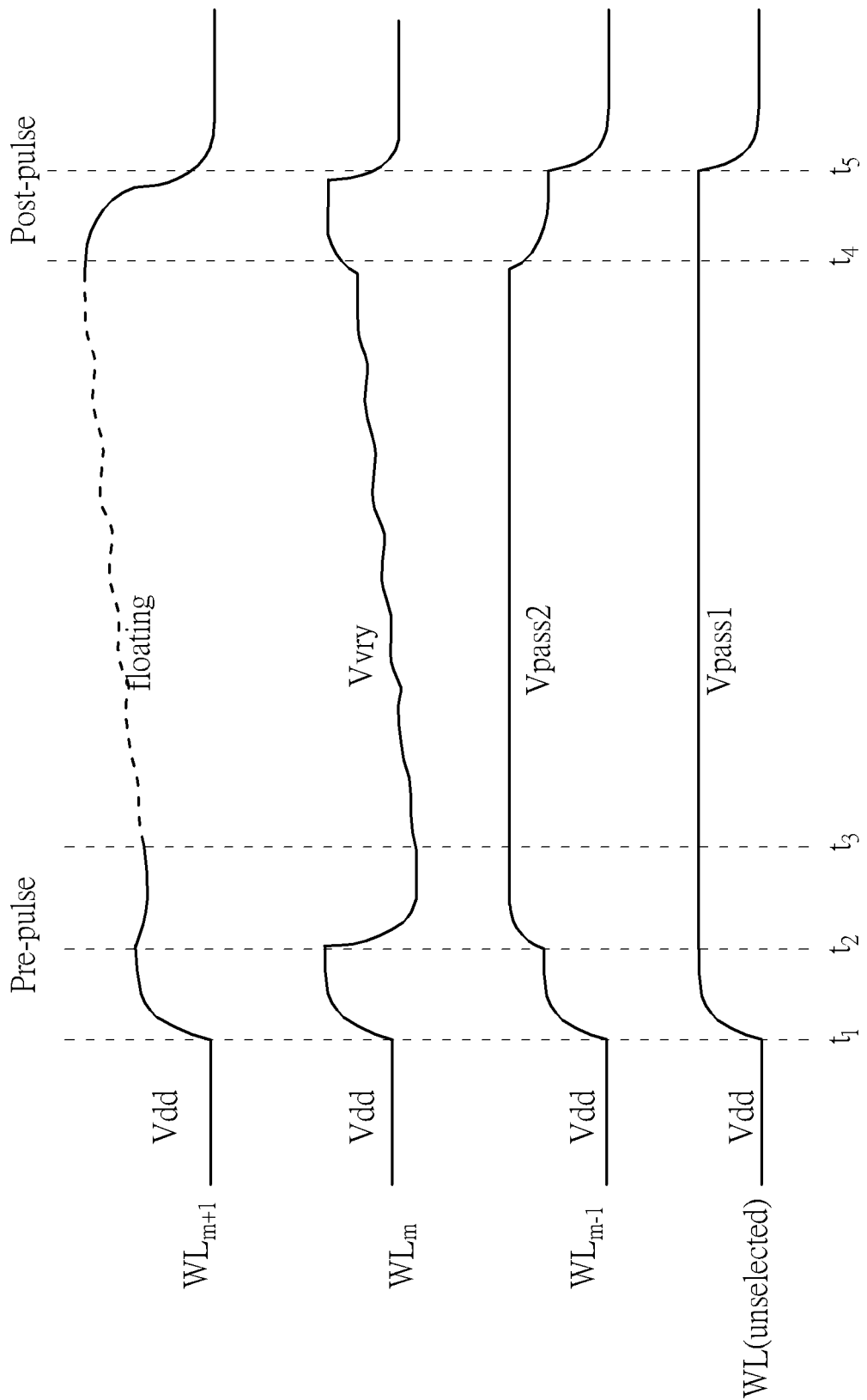
FIG. 7 illustrates a verification scheme of the programming method of an embodiment.

FIG. 7 illustrates a verification scheme of the programming method of another embodiment of the present invention. The verification operation illustrated in FIG. 7 is mostly similar to the illustration in FIG. 5 except that the floating voltage is applied to the first adjacent wordline $WL_{m+1}$ immediately at time t2. The floating voltage is maintained on the first adjacent wordline $WL_{m+1}$ until time t4. The rest of the operation is substantially the same the diagram shown in FIG. 5.

Figure 8:
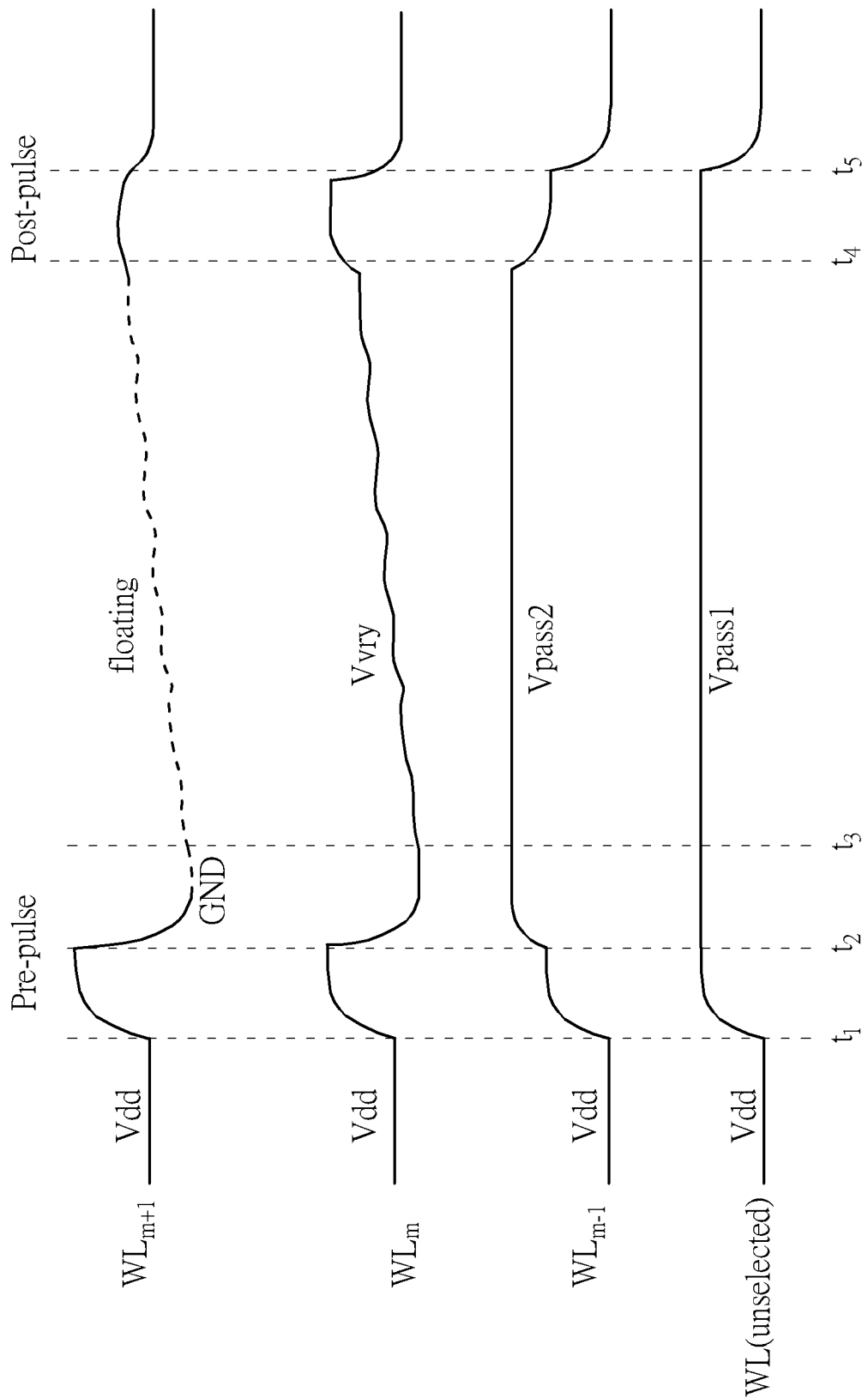
FIG. 8 illustrates a verification scheme of the programming method of an embodiment.

FIG. 8 illustrates a verification scheme of the programming method of yet another embodiment of the present invention. The verification operation illustrated in FIG. 8 is mostly similar to the illustration in FIG. 5 with except that the floating voltage is applied to the first adjacent wordline $WL_{m+1}$ when voltage on the first adjacent wordline $WL_{m+1}$ drops to the ground voltage GND at time t3. The floating voltage is maintained on the first adjacent wordline $WL_{m+1}$ until time t4. The rest of the operation is substantially the same the diagram shown in FIG. 5.

Figure 9:
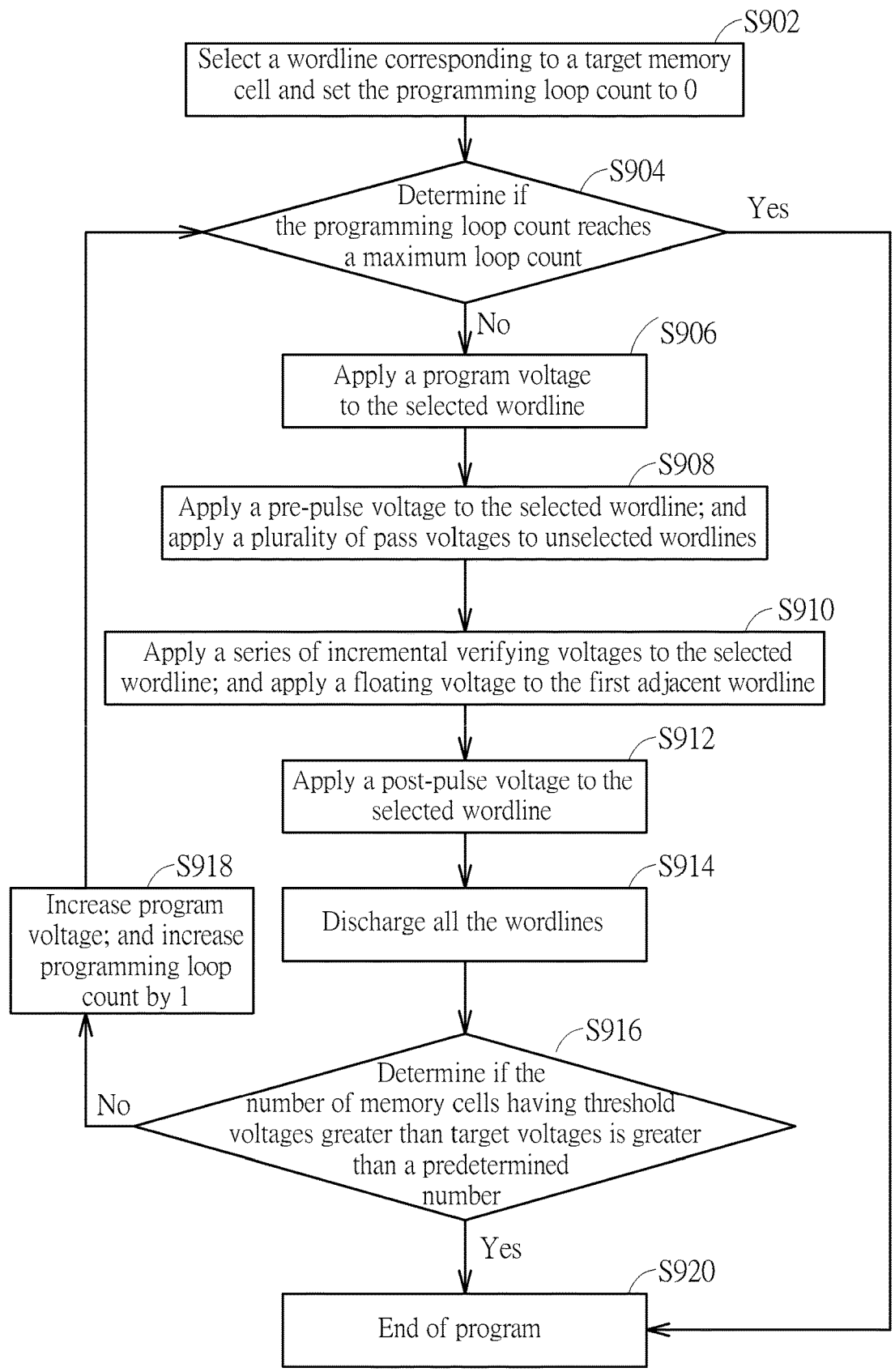
FIG. 9 is a flowchart of a method for programming the flash memory device.

FIG. 9 is a flowchart of a method 900 for programming a flash memory device. The method incorporates the verification operations previously described. The method 900 includes:

S902: Select a wordline corresponding to a target memory cell and set the programming loop count to 0;

S904: Determine if the programming loop count reaches a maximum loop count; if so, proceed to step S920; else proceed to S906;

S906: Apply a program voltage to the selected wordline;

S908: Apply a pre-pulse voltage to the selected wordline; and apply a plurality of pass voltages to unselected wordlines;

S910: Apply a series of incremental verifying voltages to the selected wordline; and apply a floating voltage to the first adjacent wordline;

S912: Apply a post-pulse voltage to the selected wordline;

S914: Discharge all the wordlines;

S916: Determine if the number of memory cells having threshold voltages greater than target voltages is greater than a predetermined number; if so proceed to step 920; else proceed to step S918;

S918: Increase program voltage; and increase programming loop count by 1; proceed to step S904;

S920: End of program.

In summary, the programming method of the embodiment includes applying the floating voltage to an adjacent wordline nearest to and programmed after the selected wordline. The influence of the parasitic capacitance between the wordlines can be reduced. Therefore, it can effectively reduce the ramp up time for the verifying voltage thus reducing the verification time and improving the overall programming performance. Also, this method can reduce the power consumption of the circuit to some degree. Furthermore, the method can be implemented without the need of addition circuits adding complexity to the design and manufacturing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of programming a flash memory device, comprising:
    selecting a first wordline of a plurality of wordlines to select a selected wordline, the selected wordline corresponding to a target memory cell; and
    performing a programming loop comprising:
        applying a program voltage to the selected wordline; and
        performing a verification to the target memory cell, the verification comprising:
            applying a pre-pulse voltage to the selected wordline;
            applying a plurality of pass voltages to unselected wordlines of the plurality of wordlines;
            after applying the pre-pulse voltage, applying a series of incremental verifying voltages to the selected wordline; and
            after applying the pre-pulse voltage, applying a floating voltage to a second wordline of the plurality of wordlines, the second wordline being adjacent to the selected wordline which is programmed after the selected wordline.

2. The method of claim 1, the programming loop further comprising discharging each of the plurality of wordlines after the verification.

3. The method of claim 1, the programming loop further comprising ending the programming loop if a number of memory cells having threshold voltages greater than target voltages is greater than a predetermined number.

4. The method of claim 1, the programming loop further comprising increasing the program voltage.

5. The method of claim 1 further comprising ending the programming loop if a programming loop count reaches a maximum loop count.

6. A method of programming a flash memory device, comprising:
    selecting a first wordline of a plurality of wordlines to select a selected wordline, the selected wordline corresponding to a target memory cell; and
    performing a programming loop comprising:
        applying a program voltage to the selected wordline; and
        performing a verification to the target memory cell, the verification comprising:
            applying a pre-pulse voltage to the selected wordline;
            applying a plurality of pass voltages to unselected wordlines of the plurality of wordlines;
            after applying the pre-pulse voltage, applying a series of incremental verifying voltages to the selected wordline; and
            after applying the pre-pulse voltage, discharging a second wordline of the plurality of wordlines to a system voltage level, the second wordline being adjacent to the selected wordline which is programmed after the selected wordline; and
            after discharging the second wordline to the system voltage level, applying a floating voltage to the second wordline.

7. The method of claim 6, the programming loop further comprising discharging each of the plurality of wordlines after the verification.

8. The method of claim 6, the programming loop further comprising ending the programming loop if a number of memory cells having threshold voltages greater than target voltages is greater than a predetermined number.

9. The method of claim 6, the programming loop further comprising increasing the program voltage.

10. The method of claim 6 further comprising ending the programming loop if a programming loop count reaches a maximum loop count.

11. A method of programming a flash memory device, comprising:
    selecting a first wordline of a plurality of wordlines to select a selected wordline, the selected wordline corresponding to a target memory cell; and
    performing a programming loop comprising:
        applying a program voltage to the selected wordline; and
        performing a verification to the target memory cell, the verification comprising:
            applying a pre-pulse voltage to the selected wordline;
            applying a plurality of pass voltages to unselected wordlines of the plurality of wordlines;
            after applying the pre-pulse voltage, applying a series of incremental verifying voltages to the selected wordline; and
            after applying the pre-pulse voltage, discharging a second wordline of the plurality of wordlines to a ground voltage level, the second wordline adjacent to the selected wordline and on a side of the selected wordline nearest a bitline transistor; and
            after discharging the second wordline to the ground voltage level, applying a floating voltage to the second wordline.

12. The method of claim 11, the programming loop further comprising discharging each of the plurality of wordlines after the verification.

13. The method of claim 11, the programming loop further comprising ending the programming loop if a number of memory cells having threshold voltages greater than target voltages is greater than a predetermined number.

14. The method of claim 11, the programming loop further comprising increasing the program voltage.

15. The method of claim 11 further comprising ending the programming loop if a programming loop count reaches a maximum loop count.

\* \* \* \* \*